United States Patent
Yamanaka et al.

(10) Patent No.: US 9,093,776 B2
(45) Date of Patent: Jul. 28, 2015

(54) ELECTRONIC CONTROL DEVICE

(71) Applicant: HITACHI AUTOMOTIVE SYSTEMS, LTD., Ibaraki (JP)

(72) Inventors: Kentaro Yamanaka, Ota (JP); Hironori Ohhashi, Isesaki (JP); Yoshio Kawai, Ota (JP)

(73) Assignee: HITACHI AUTOMOTIVE SYSTEMS, LTD., Hitachinaka-shi (JP)

( * ) Notice: Subject to any disclaimer, the term of this patent is extended or adjusted under 35 U.S.C. 154(b) by 85 days.

(21) Appl. No.: 13/889,408

(22) Filed: May 8, 2013

(65) Prior Publication Data
US 2014/0080329 A1 Mar. 20, 2014

(30) Foreign Application Priority Data

Sep. 14, 2012 (JP) .................................. 2012-202209

(51) Int. Cl.
*H05K 1/00* (2006.01)
*H01R 13/52* (2006.01)
*H05K 7/14* (2006.01)
*H05K 5/00* (2006.01)

(52) U.S. Cl.
CPC .......... *H01R 13/5202* (2013.01); *H05K 5/0069* (2013.01); *H05K 7/14* (2013.01)

(58) Field of Classification Search
USPC .................. 439/76.1; 361/736, 752
See application file for complete search history.

(56) References Cited

U.S. PATENT DOCUMENTS

| | | | | |
|---|---|---|---|---|
| 7,744,381 B2 * | 6/2010 | Honda | ............................ | 439/79 |
| 7,931,478 B2 * | 4/2011 | Yamaguchi | .................. | 439/76.1 |
| 8,727,794 B2 * | 5/2014 | Tanaka et al. | ................ | 439/76.1 |
| 8,770,989 B2 * | 7/2014 | Ohhashi et al. | .............. | 439/76.1 |
| 8,830,686 B2 * | 9/2014 | Nomoto | ........................ | 361/752 |

FOREIGN PATENT DOCUMENTS

JP 6-76872 3/1994

* cited by examiner

*Primary Examiner* — Hien Vu
(74) *Attorney, Agent, or Firm* — Foley & Lardner LLP

(57) ABSTRACT

An electronic control device including a circuit board, a connector with connector pins having a board connecting portion at which the connector pins are electrically connected with the circuit board, a pair of housing members accommodating the circuit board and the connector therebetween, a waterproof seal portion through which connection between the connector and the pair of housing members and connection between the pair of housing members are provided in a fluid-tight manner, the waterproof seal portion including a connector-side waterproof seal portion disposed between the connector and one of the pair of housing members which is opposed to the board connecting portion of the connector pins, and a barrier portion disposed between the board connecting portion of the connector pins and the connector-side waterproof seal portion.

12 Claims, 11 Drawing Sheets

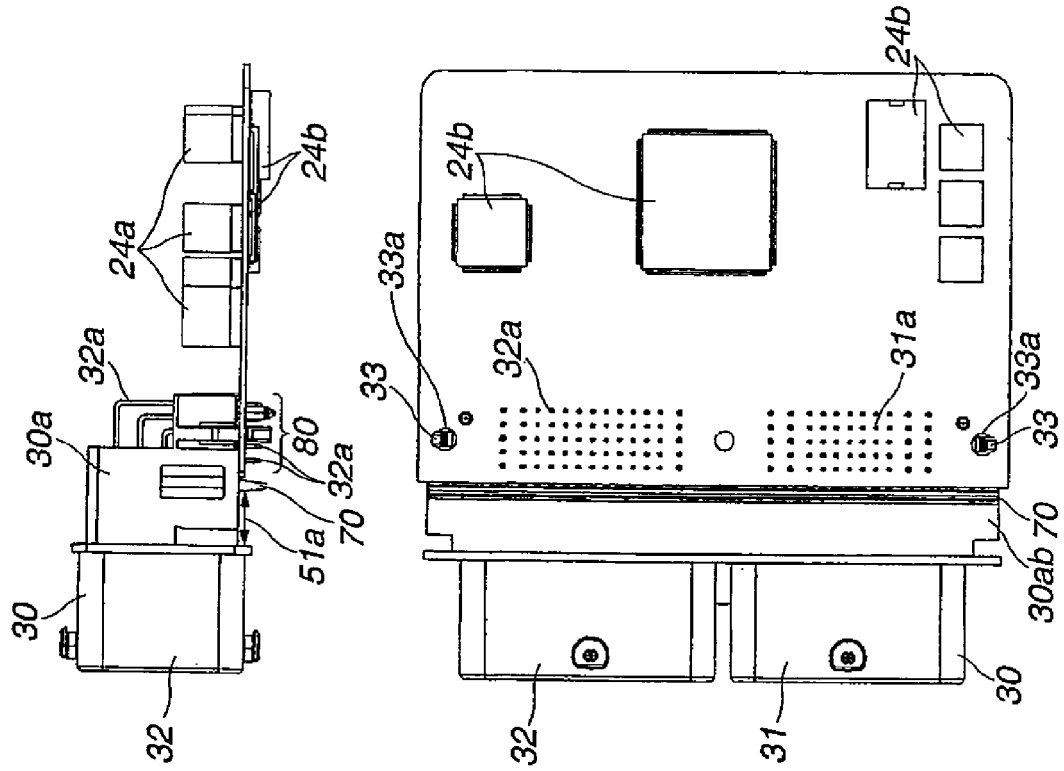
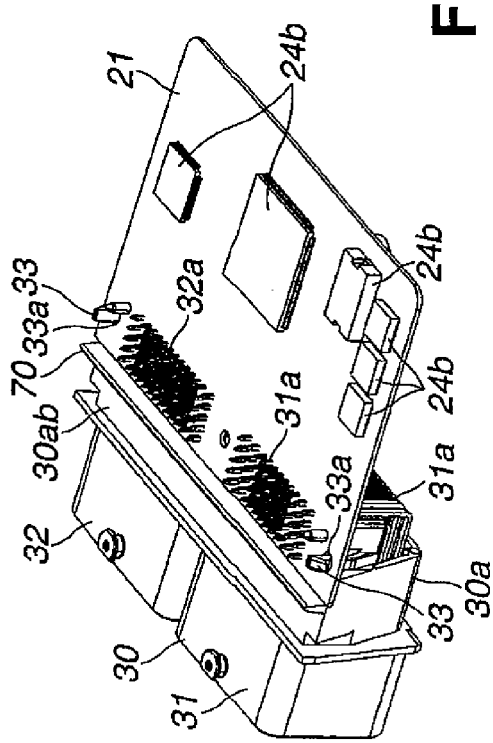

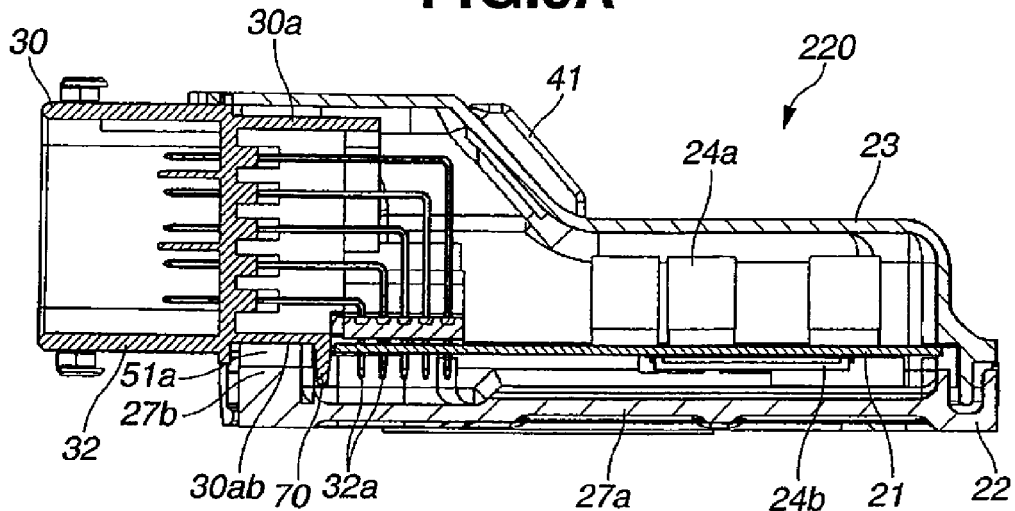
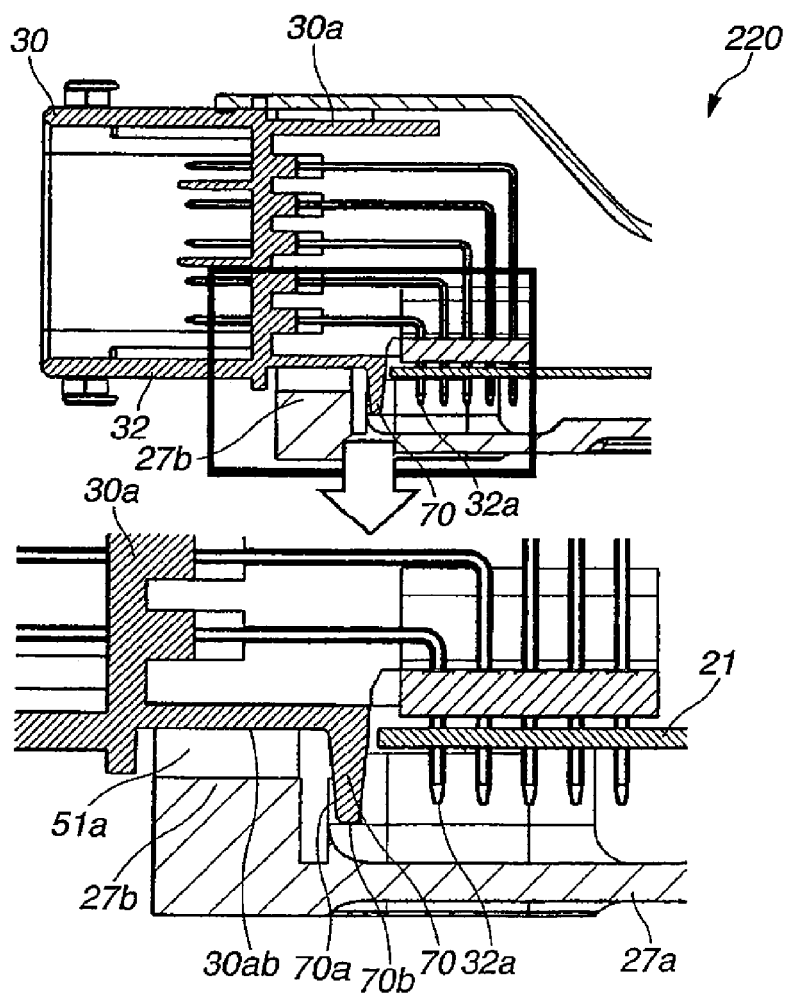

ELECTRONIC CONTROL DEVICE

BACKGROUND OF THE INVENTION

The present invention relates to an electronic control device for a vehicle which includes a circuit board accommodated in a protection space within a housing.

A generally known electronic control device such as an engine control unit, a control unit for an automatic transmission, etc. which is installed in a vehicle, includes a housing formed by a pair of housing members joined with each other, and a circuit board accommodated in a protection space (for instance, a waterproof space) within the housing. The circuit board is equipped with electronic parts mounted thereto and a connector attached thereto.

A so-called connector horizontal exit electronic control device in which a portion of a connector attached to the circuit board is exposed outside through a window provided on a side face of the housing includes a waterproof seal portion formed on a connecting portion between the connector and the pair of housing members. The waterproof seal portion is filled with a waterproof sealant.

In addition, one end of a connector pin (male terminal) provided on the connector is electrically connected to the circuit board.

A connecting portion of the connector pin which is connected to the circuit board is subjected to application of flux and a coating agent and soldering to a land of the circuit board. At this time, in a case where the flux, the coating agent and a solder ball are adhered to the waterproof seal portion of the connector, the waterproof sealant will be prevented from hardening to thereby cause adverse influence on the waterproof seal portion.

In order to prevent the flux and the coating agent from being adhered to the waterproof seal portion of the connector, a conventional electronic control device as shown in FIG. 11 is constructed such that sufficiently large clearance 5 is provided between a connecting portion (flux applied portion 3) of connector pin 1 to circuit board 2, and waterproof seal portion 4 of connector 6.

In FIG. 11, reference numerals 6a and 6b respectively denote a connection port of connector 6, and an attachment base portion of connector 6 which is to be attached to circuit board 2. Reference numerals 7 and 8 respectively denote electronic parts and a flux applying nozzle.

In addition, Japanese Patent Application Unexamined Publication No. 6-076872 A discloses a printed circuit board as shown in FIGS. 12A-12B. The printed circuit board includes split board 12 and disposal board 13 that covers connector A. Split board 12 with disposal board 13 is subjected to soldering to connector A from the side of lead foot C. After that, disposal board 13 is separated from split board 12 at cutout portion 11a, and then removed.

SUMMARY OF THE INVENTION

However, in the above-described former conventional art as shown in FIG. 11, a size of the circuit board must be increased due to the provision of sufficiently large clearance 5 between flux applied portion 3 and waterproof seal portion 4.

In addition, in the above-described latter conventional art as shown in FIGS. 12A-12B, removal of the disposal board leads to reduction of the number of the circuit boards as the final products, thereby causing an increased unit cost of the circuit board.

The present invention has been made in view of the above-described problems of the conventional arts. It is an object of the present invention to provide an electronic control device capable of suppressing adverse influence on a waterproof seal portion without being upsized.

In a first aspect of the present invention, there is provided an electronic control device including:

a circuit board;

a connector disposed on one side of the circuit board, the connector being provided with connector pins having a board connecting portion at which the connector pins are electrically connected with the circuit board;

a pair of housing members accommodating the circuit board and the connector therebetween such that the connector is opposed to a peripheral edge portion of one of the pair of housing members and a peripheral edge portion of the other of the pair of housing members;

a waterproof seal portion through which connection between the connector and the pair of housing members and connection between the pair of housing members are provided in a fluid-tight manner, the waterproof seal portion including a connector-side waterproof seal portion disposed between the connector and the one of the pair of housing members which is opposed to the board connecting portion of the connector pins; and a barrier portion disposed between the board connecting portion of the connector pins and the connector-side waterproof seal portion.

In the electronic control device according to the first aspect of the present invention, since the barrier portion is disposed between the connector-side waterproof seal portion and the board connecting portion of the connector pins (i.e., the portion which is subjected to application of flux and a coating agent or soldering to the circuit board), the application agent such as the flux, the coating agent, etc. applied to the board connecting portion of the connector pins can be prevented from being adhered to the connector-side waterproof seal portion.

In a second aspect of the present invention, there is provided the electronic control device according to the first aspect of the present invention, wherein the barrier portion projects from the connector toward the one of the pair of housing members by an amount larger than an amount of projection of the connector pins that project from one surface of the circuit board toward the one of the pair of housing members, the one surface of the circuit board being opposed to the one of the pair of housing members.

In the electronic control device according to the second aspect of the present invention, it is possible to more effectively suppress adhesion of the application agent to the connector-side waterproof seal portion.

In a third aspect of the present invention, there is provided the electronic control device according to the first aspect of the present invention, wherein the connector-side waterproof seal portion comprises an extension seal portion extending toward the one of the pair of housing members in a space between a wall surface of the peripheral edge portion of the one of the pair of housing members and a side surface of the barrier portion which is opposed to the wall surface of the peripheral edge portion of the one of the pair of housing members, and wherein the connector-side waterproof seal portion and the extension seal portion are filled with a sealant.

In the electronic control device according to the third aspect of the present invention, a seal length of the connector-side waterproof seal portion becomes a sum of a width of the connector-side waterproof seal portion and an amount of projection of the barrier portion which projects from the connector toward the one of the pair of housing members. As a result, the seal length of the connector-side waterproof seal portion is increased to thereby enhance salt damage resistance. Further, it is possible to ensure a necessary seal length and also reduce a dimension of the width of the connector-side waterproof seal portion to thereby downsize of the electronic control device.

Other objects and features of this invention will become understood from the following description with reference to the accompanying drawings.

BRIEF DESCRIPTION OF THE DRAWINGS

FIG. 4A is a perspective view of the electronic control device according to the first embodiment of the present invention with a housing being removed, when viewed from a lower of a circuit board.

FIG. 4B is a side view of the electronic control device according to the first embodiment of the present invention with the housing being removed.

FIG. 4C is a bottom plan view of the electronic control device according to the first embodiment of the present invention with the housing being removed.

FIG. 9A is a sectional view similar to FIG. 7A, but shows an electronic control device according to a third embodiment of the present invention.

FIG. 9B is an enlarged sectional view of essential parts of the electronic control device according to the third embodiment of the present invention as shown in FIG. 9A.

DETAILED DESCRIPTION OF THE INVENTION

An electronic control device according to embodiments of the present invention, which is applied to an engine control unit of a vehicle, will be explained in detail by referring to the accompanying drawings.

[First Embodiment]

Figure 1:
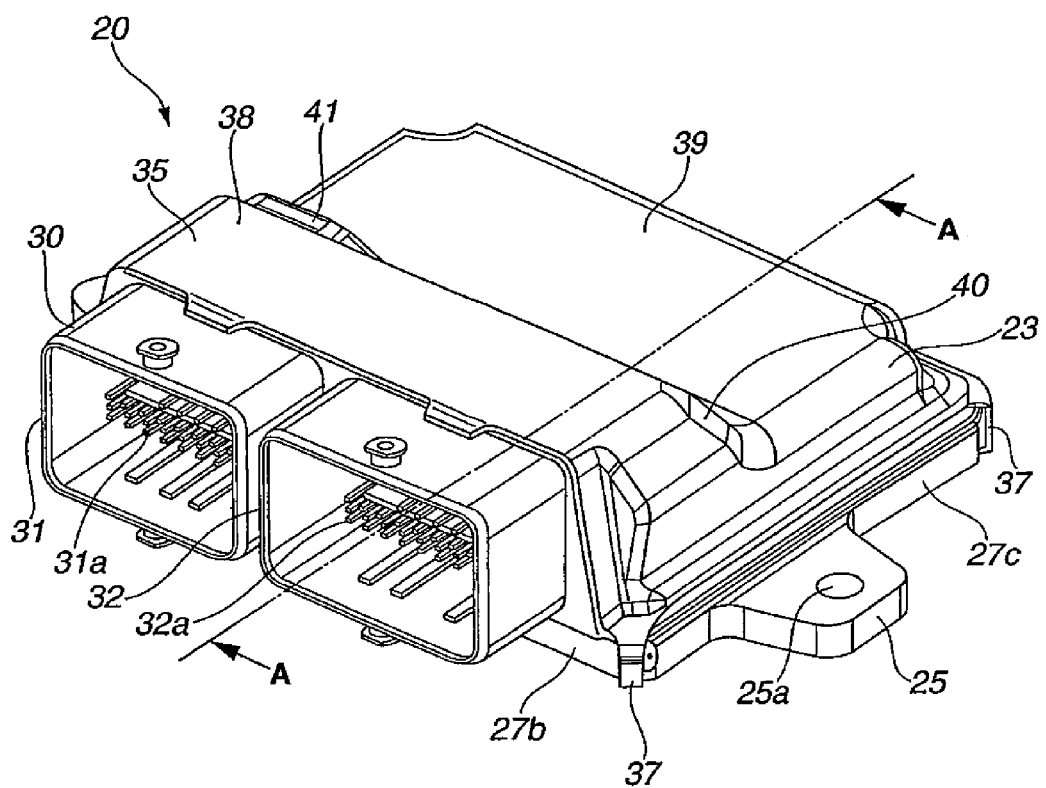
FIG. 1 is a perspective view of an electronic control device according to a first embodiment of the present invention.
Figure 2:
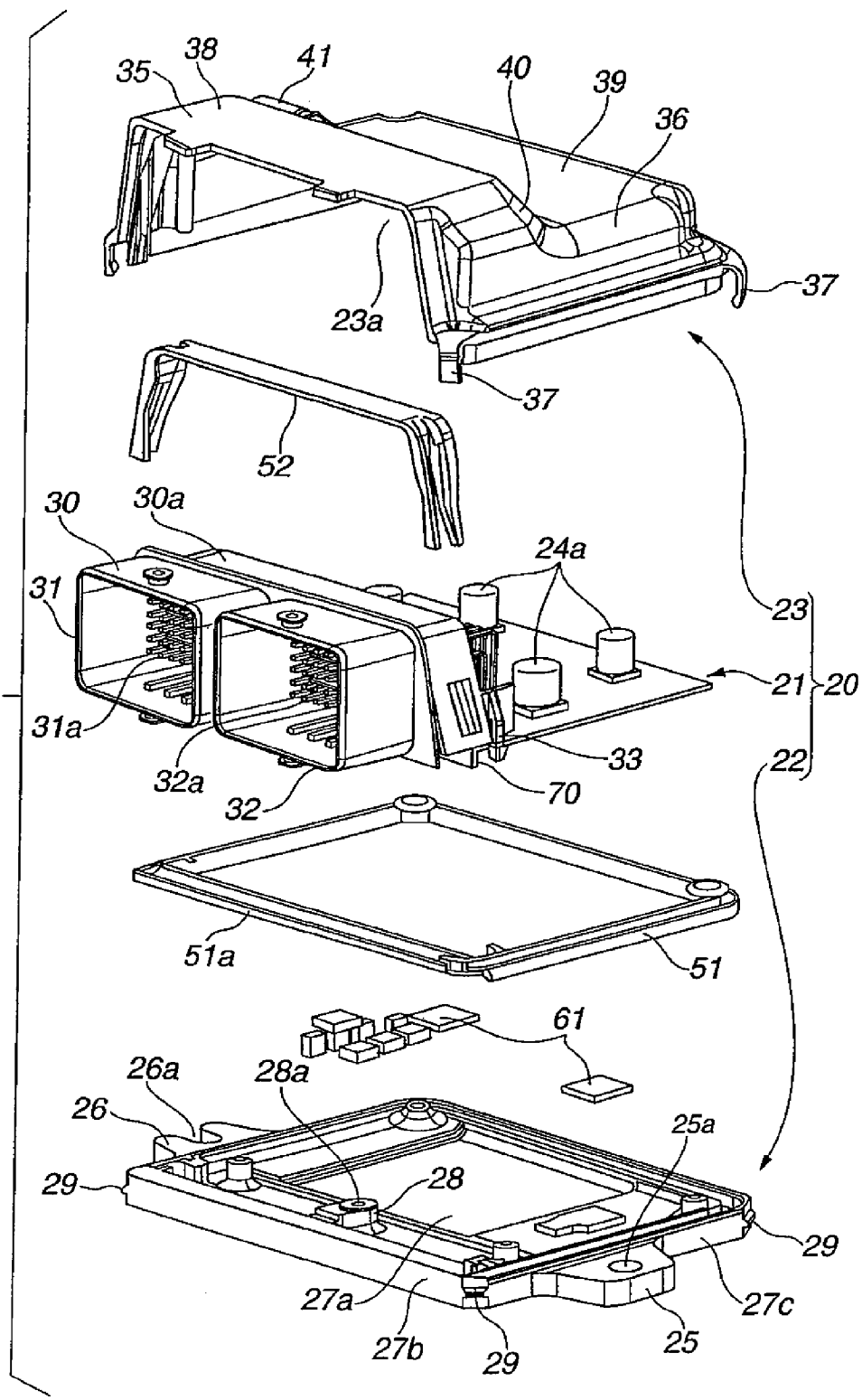
FIG. 2 is an exploded perspective view of the electronic control device according to the first embodiment of the present invention when viewed from an upper side of the electronic control device.
Figure 3:
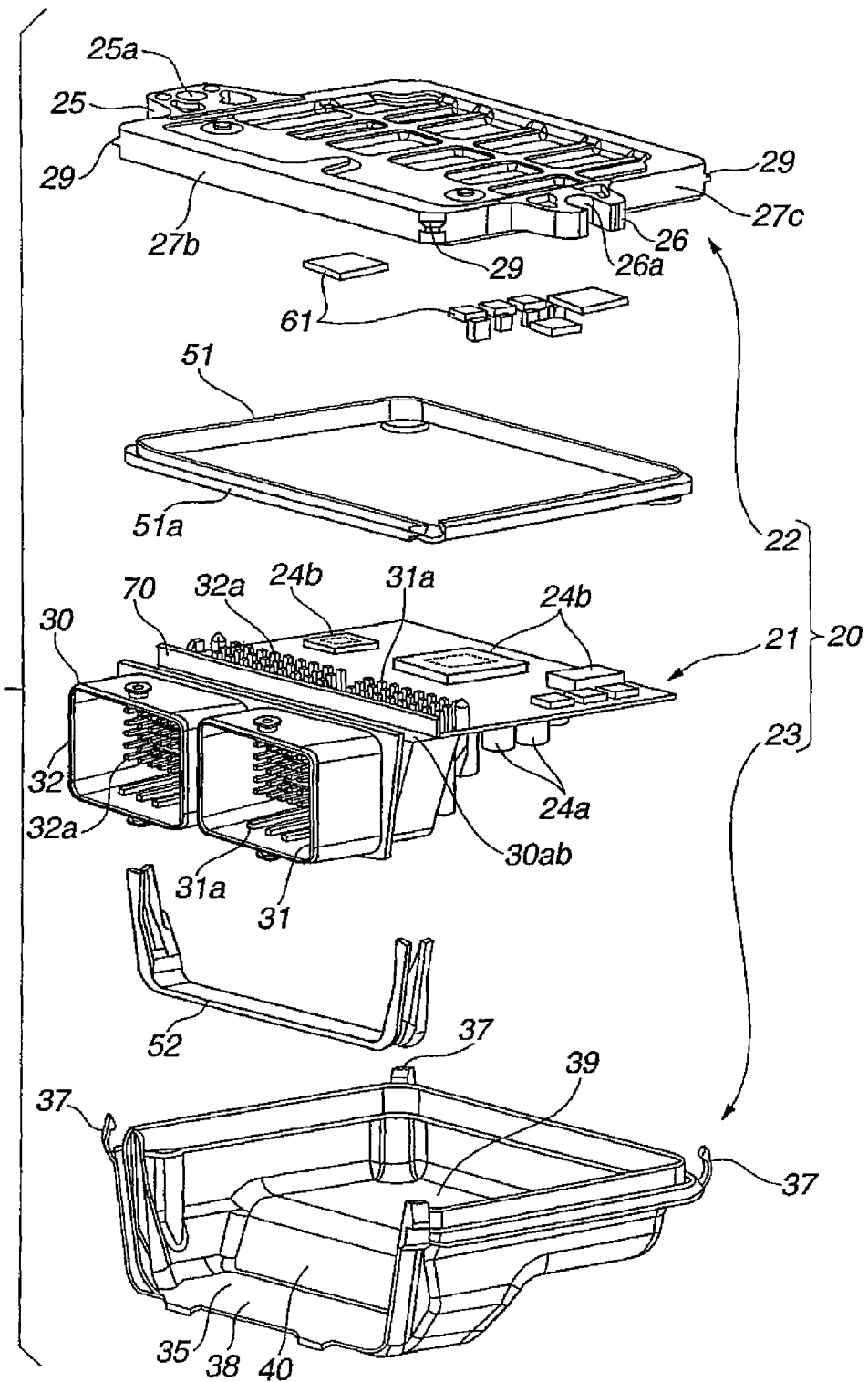
FIG. 3 is an exploded perspective view of the electronic control device according to the first embodiment of the present invention when viewed from a lower side of the electronic control device.

Referring to FIG. 1 to FIG. 6C, a basic construction of the electronic control device of the first embodiment is explained. In the basic construction of the first embodiment, electronic control device 20 includes a pair of housing members (case 22 and cover 23 as explained later) which cooperate to form a housing, and circuit board 21 accommodated in an inside space within the housing. In the following explanation, the expression "vertical direction" of electronic control device 20 as shown in FIG. 1 to FIG. 3, that is, a thickness direction of circuit board 21 may be used as a vertical direction of electronic control device 20 itself. However, the vertical direction of electronic control device 20 itself does not always correspond to a vertical direction of the vehicle. In a case where electronic control device 20 is mounted to the vehicle in an upright attitude, the vertical direction of electronic control device 20 as shown in FIG. 1 extends along a forward-and-rearward direction of the vehicle.

Electronic control device 20 includes generally rectangular plate-shaped case 22 attached to the side of a vehicle body, generally rectangular box-shaped cover 23 that cooperates with case 22 to form a housing, and circuit board 21 accommodated in a protective inside space within the housing. Case 22 and cover 23 are connected with each other in a fluid-tight manner through a seal material. Circuit board 21 has electronic parts 24a, 24b mounted thereon. Case 22 includes brackets 25, 26 through which electronic control device 20 is mounted to the side of the vehicle body, for instance, an engine room (not shown). A bottom surface of each of brackets 25, 26 serves as a mount surface that is fixed to the side of the vehicle body. In this embodiment, the mount surface is configured to be parallel to a bottom surface of case 22. However, the mount surface may be inclined relative to the bottom surface of case 22 depending on a configuration of brackets 25, 26 as mount portions that are mounted to the side of the vehicle body.

As best shown in FIG. 2 and FIG. 3, connector 30 is attached to a part of a peripheral side of circuit board 21. Connector 30 includes first connection port 31 and second connection port 32 which are connected with external connectors (not shown), respectively. The two connection ports 31, 32 are joined with each other through mount base portion 30a and form connector 30 as a one-piece body. Connector 30 is fixed to circuit board 21 through mount base portion 30a by a suitable method, for instance, by means of a plurality of screws. Connection ports 31, 32 joined with each other through mount base portion 30a are exposed an outside through window portion 23a. Window portion 23a is defined between case 22 and cover 23. Connector 30 is connected at connection ports 31, 32 with a connector provided on the side of the vehicle.

As best shown in FIG. 4A and FIG. 4C, connector 30 also includes positioning projections 33 formed on an outer peripheral side of mount base portion 30a in an opposed to and spaced relation to each other. Positioning projections 33 are respectively fitted into positioning holes 33a formed in circuit board 21.

Connector 30 also includes a plurality of connector pins (male terminals) 31a, 32a electrically connected to a wiring circuit pattern on circuit board 21. Connector pins 31a, 32a are connected with a plurality of female terminals accommodated in a connector (not shown) that is connected with a given equipment such as a sensor, a pump, etc. Thus, connector 30 is electrically connected to the given equipment.

Case 22 is made of a metal material having an excellent thermal conductivity such as aluminum and formed into a generally rectangular plate shape, specifically, a rectangular shallow box shape having a slightly raised peripheral wall. Specifically, case 22 includes generally rectangular bottom wall 27a, and front wall 27b, opposed side walls 27c and a rear wall which upwardly extend from an outer peripheral edge of bottom wall 27a to define a shallow box shape having an open top.

Circuit board 21 is fixed to case 22 through board fixing portion 28. Board fixing portion 28 is uprightly disposed on a front side of an upper surface of bottom wall 27a and in a central position in a longitudinal direction of front wall 27b. Board fixing portion 28 is formed with female screw hole 28a into which a screw (not shown) is screwed. By screwing the screw into female screw hole 28a, circuit board 21 is fixed to case 22 such that circuit board 21 is supported by board fixing portion 28.

Side walls 27c have a pair of brackets 25, 26 that serve to mount electronic control device 20 to the vehicle body (not shown). Brackets 25, 26 are integrally formed with side walls 27c and extend from side walls 27c in a direction parallel to the longitudinal direction of front wall 27b. Bracket 25 has through hole 25a vertically extending through bracket 25. Bracket 26 has cutout 26a opened to an outer peripheral surface of bracket 26 in the direction parallel to the longitudinal direction of front wall 27b. Case 22 is mounted to the vehicle body through bolts (not shown) which are inserted into through hole 25a and cutout 26a.

Cover 23 is made of a desired synthetic resin material that is lighter in weight than a metal material and lower in cost than the metal material, and formed into a generally rectangular box shape. Cover 23 includes rectangular upper wall 35 that covers circuit board 21 and connector 30, and peripheral side wall 36 that surrounds three side peripheries of upper wall 35 except for window portion 23a. Upper wall 35 is opposed to case 22 such that circuit board 21 and connector 30 are disposed between upper wall 35 and case 22.

As shown in FIG. 1 to FIG. 3, cover 23 has stop pawls 37 at four corners on an outer peripheral surface of cover 23. Each of stop pawls 37 extends outwardly from an upper edge of each of the four corners, and is downwardly curved. Stop pawls 37 are formed integrally with cover 23, and are elastically deformable to hook and engage projections 29 of case 22. Each of projections 29 is formed at four corners on an outer peripheral surface of case 22. Stop pawls 37 and projections 29 cooperate with each other to form a so-called snap-fit fixing construction through which cover 23 is stiffly assembled to case 22 to which circuit board 21 with connector 30 is fixed.

Figure 5A:
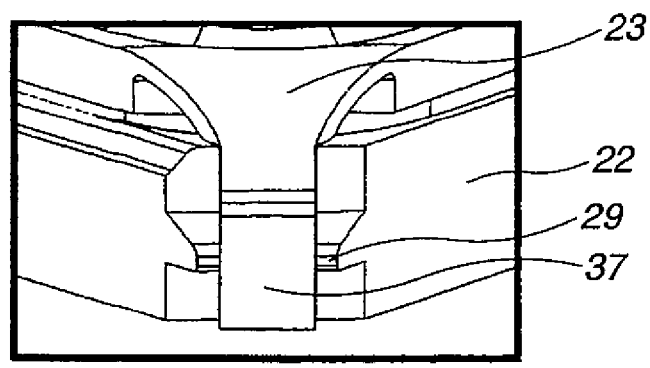
FIGS. 5A-5D are diagrams showing essential parts of a fixing construction of the electronic control device according to the first embodiment of the present invention.
Figure 5B:
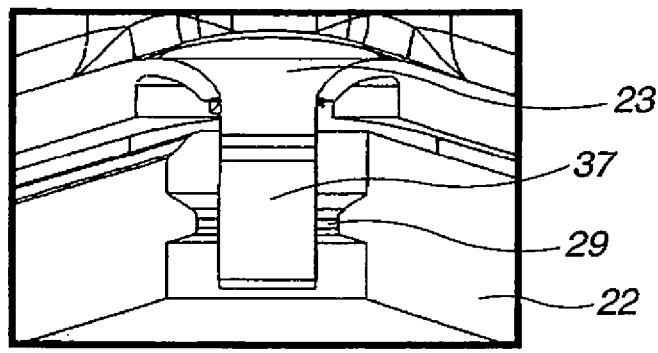
Figure 5C:
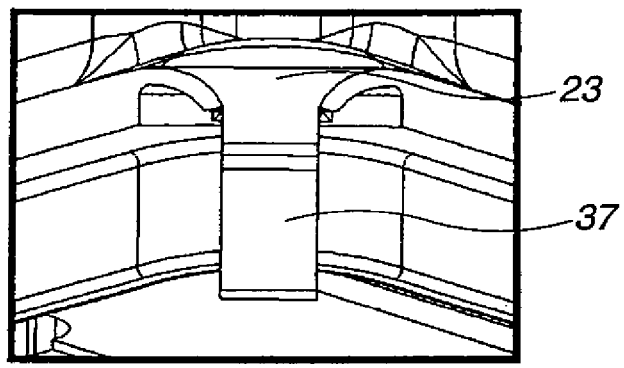
Figure 5D:
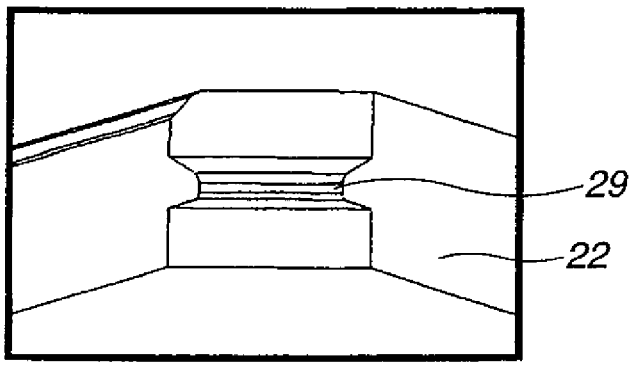

FIGS. 5A-5D show the snap-fit fixing construction in this embodiment, which is provided at each of the four corners of cover 23 and the corresponding corner of case 22. As shown in FIG. 5A and FIG. 5B, stop pawl 37 of cover 23 is elastically deformed to engage projection 29 of case 22 in a hook manner. FIG. 5C shows stop pawl 37 formed at the corner of cover 23. FIG. 5D shows projection 29 formed at the corner of case 22.

In the snap-fit fixing construction as shown in FIGS. 5A-5D, cover 23 may be made of a metal material such that stop pawls 37 are elastically deformed to hook and engage projections 29 of case 22.

FIGS. 6A-6D show a modified fixing construction in which heat staking stop portions 90 are formed between four corners of cover 23 and four corners of case 22 which are opposed to the four corners of cover 23 in the vertical direction of electronic control device 20.

Figure 6A:
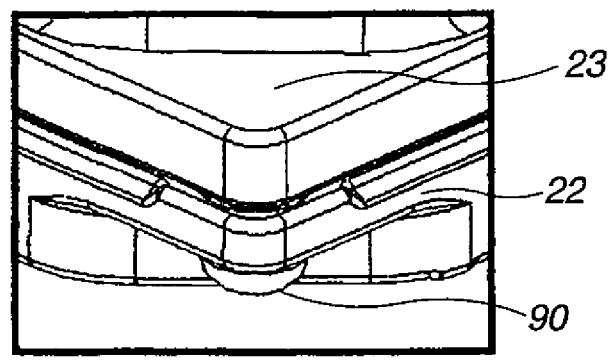
FIGS. 6A-6D are diagrams showing essential parts of a modified fixing construction of the electronic control device according to the first embodiment of the present invention.
Figure 6B:
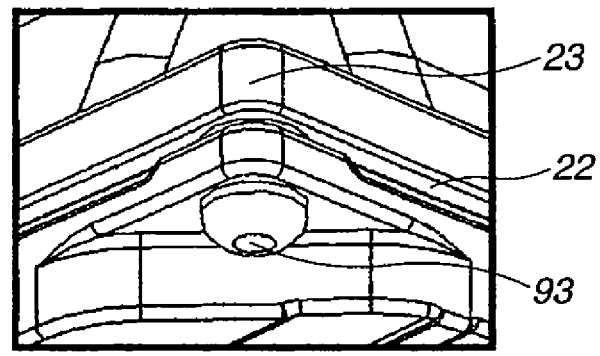
Figure 6C:
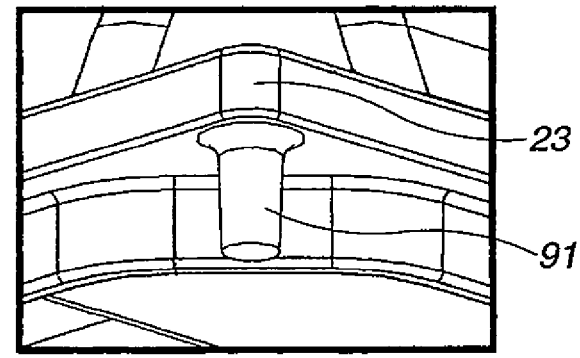
Figure 6D:
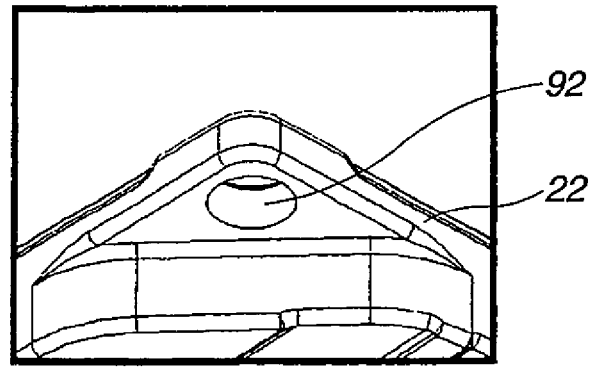

As shown in FIG. 6C, heat staking peg 91 is uprightly disposed on a lower surface of cover 23 at each of the four corners. Heat staking peg 91 is inserted into peg hole 92 formed at each of the four corners of case 22 as shown in FIG. 6D. Peg hole 92 extends through case 22 in a thickness direction of case 22. After that, as shown in FIG. 6B, heat staking head 93 is formed at a tip end of heat staking peg 91, so that heat staking peg 91 with heat staking head 93 is engaged with peg hole 92. As a result, as shown in FIG. 6A, heat staking stop portion 90 is formed.

As explained above, in order to fix cover 23 and case 22 to each other, the snap-fit fixing construction or the heat staking fixing construction can be used. In addition, other fixing construction using a fastening member such as a screw, a bolt, etc. may also be used.

In electronic control device 20, connector 30 opened toward one side of electronic control device 20 is attached to one end (a front end) of circuit board 21. With this construction, cover 23 is formed into a stepped shape having portions on the side of connector 30 and the side of circuit board 21 which are different in dimension (height) in a thickness direction of circuit board 21 from each other. Specifically, upper wall 35 of cover 23 includes upper step portion 38 and lower step portion 39 which are parallel to bottom wall 27a of case 22.

Upper step portion 38 covering connector 30 has a larger height in the thickness direction of circuit board 21 than that of lower step portion 39 covering circuit board 21. Upper step portion 38 and lower step portion 39 are smoothly connected with each other through inclined wall portion 40.

Inclined wall portion 40 is a flat portion inclined with a predetermined inclination angle, specifically, about 45 degrees, relative to bottom wall 27a of case 22. Accordingly, inclined wall portion 40 is inclined with the same inclination angle relative to upper step portion 38 and lower step portion 39. Inclined wall portion 40 includes protection wall 41 serving to protect a vent hole (not shown) that extends through inclined wall portion 40 in a thickness direction thereof. A ventilation waterproof thin film is attached to the vent hole. The ventilation waterproof thin film may be made of a material such as Gore-Tex (registered trademark) which has both a waterproof property and an air permeability. Protection wall 41 serves to protect the ventilation waterproof thin film from high-temperature and high-pressure water directly sprayed thereto during car wash.

Housing seal portion (waterproof seal portion) 51 formed by filling a sealant is provided over an entire connecting surface portion as a mating surface portion between an upper surface of a peripheral edge portion of case 22 and a lower surface of a peripheral edge portion of cover 23. Further, connector seal portion (waterproof seal portion) 52 formed by filling a sealant is provided over an entire connecting surface portion between an outer peripheral surface of mount base portion 30a of connector 30 and an inner peripheral surface of a portion of cover 23 which defines window portion 23a.

Housing seal portion 51 and connector seal portion 52 are connected with each other at lower portions of both side walls of mount base portion 30a of connector 30. The sealant disposed at the lower portions of both side walls of mount base portion 30a commonly serves as housing seal portion 51 and connector seal portion 52.

As shown in FIG. 2 and FIG. 3, housing seal portion 51 includes connector-side housing seal portion (connector-side waterproof seal portion according to the present invention) 51a provided at a connecting surface portion between lower surface 30ab of mount base portion 30a of connector 30 and an upper surface of front wall 27b of case 22. Connection between connector 30 and case 22 and cover 23 and connection between case 22 and cover 23 are provided in a fluid-tight manner through housing seal portion 51 and connector seal portion 52.

The sealant is not particularly limited to a specific one as long as the sealant has flowability. Examples of the sealant may include an epoxy-based sealant, a silicone-based sealant, an acryl-based sealant. The sealant can be suitably selected in accordance with a specification and requirements of electronic control device 20.

Housing seal portion 51 and connector seal portion 52 have shapes defined when the sealants filled therein are solidified. For the sake of easy understanding, in FIG. 2 and FIG. 3, housing seal portion 51 and connector seal portion 52 are shown as individual parts separated from each other. However, these seals 51 and 52 are formed as an integral body after being solidified.

Barrier portion 70 is disposed between connector-side housing seal portion 51a and portions of connector pins 31a, 32a which are connected to circuit board 21 (hereinafter referred to as "board connecting portions of connector pins 31a, 32a"). Barrier portion 70 is formed on lower surface 30ab of mount base portion 30a so as to extend over an entire length of lower surface 30ab along the longitudinal direction of front wall 27b of case 22 and project from lower surface 30ab toward bottom wall 27a of case 22. Barrier portion 70 is formed integrally with mount base portion 30a of connector 30.

When the board connecting portions of connector pins 31a, 32a which are opposed to bottom wall 27a of case 22 are subjected to application of flux and a coating agent and soldering to lands of circuit board 21, barrier portion 70 serves to prevent the flux, the coating agent, a solder ball, a foreign material, etc. from being adhered to waterproof seal constituting portions for connector 30, particularly, being adhered to connector-side housing seal portion 51a.

Further, barrier portion 70 can serve as an objective (guide) when connector 30 and circuit board 21 are assembled into the housing. Therefore, barrier portion 70 can be used as not only a protector to suppress adhesion of the application agent to waterproof seal portion 52 but also an assembly guide.

Reference numeral 61 denotes a radiator material disposed between circuit board 21 and case 22.

Figure 7A:
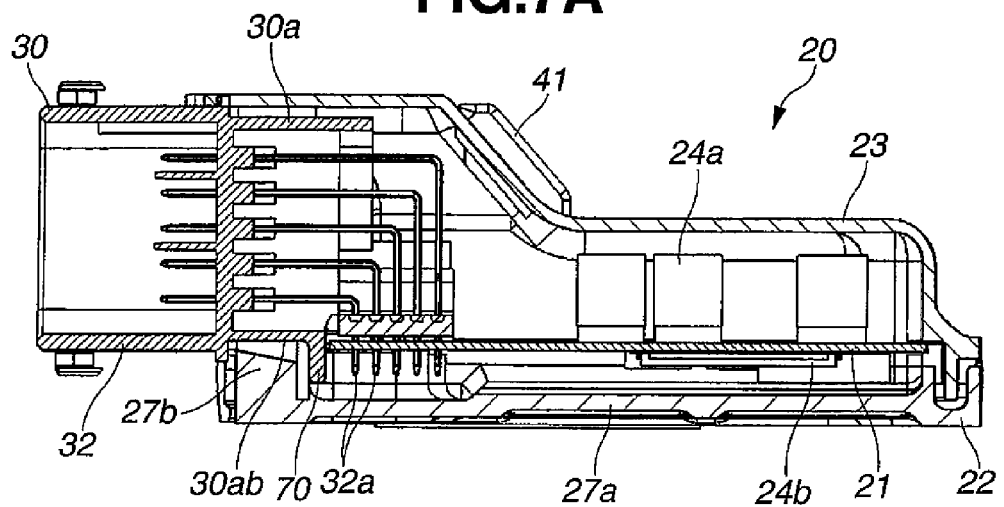
FIG. 7A is a sectional view of the electronic control device according to the first embodiment of the present invention, taken along line A-A as shown in FIG. 1.
Figure 7B:
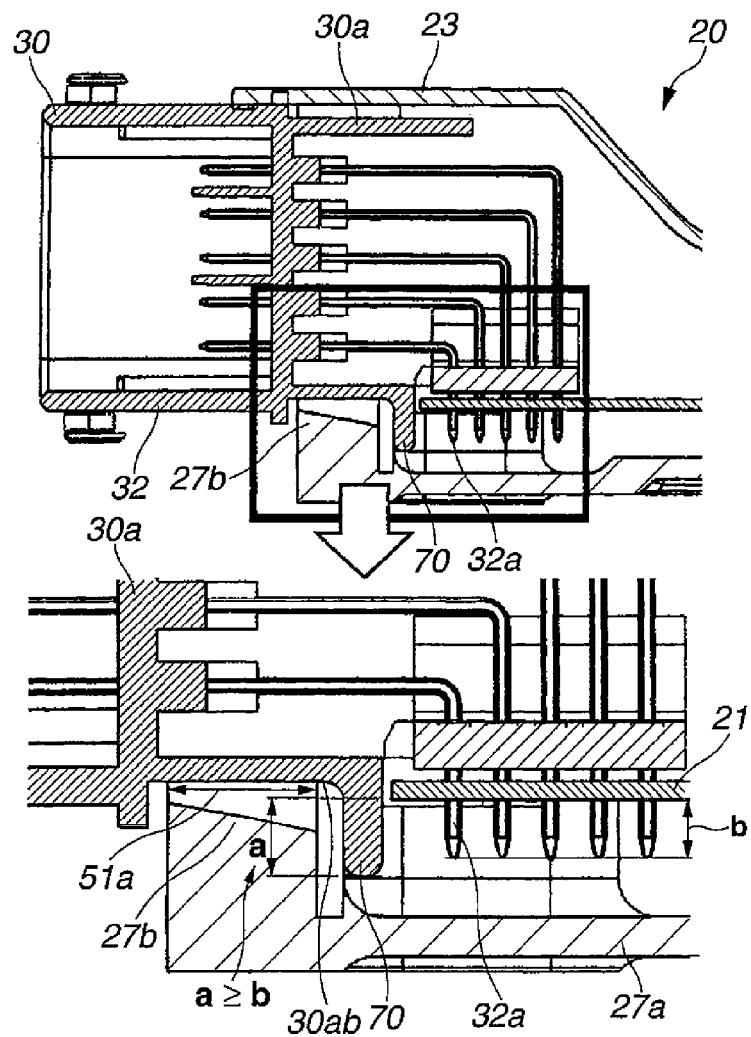
FIG. 7B is an enlarged sectional view of essential parts of the electronic control device according to the first embodiment of the present invention as shown in FIG. 7A.

Next, referring to FIG. 7A and FIG. 7B, barrier portion 70 used in electronic control device 20 is explained in detail. As shown in FIG. 7A and FIG. 7B, barrier portion 70 is configured to project toward bottom wall 27a of case 22 by an amount not smaller than an amount of projection of connector pins 31a, 32a that project from circuit board 21 toward bottom wall 27a of case 22. Specifically, a distance "a" extending from a lower surface of circuit board 21 to a tip end of barrier portion 70 is set to be not smaller than an amount of projection or projecting height "b" of connector pins 31a, 32a extending from the lower surface of circuit board 21 to tip ends of connector pins 31a, 32a. In this embodiment as shown in FIG. 7A and FIG. 7B, the distance "a" is larger than the amount of projection "b" of connector pins 31a, 32a.

By setting the amount of projection of barrier portion 70 as described above, when the board connecting portions of connector pins 31a, 32a (applied portion 80 as shown in FIG. 4B) is subjected to application of the flux and the coating agent and soldering to lands of circuit board 21, it is possible to more effectively suppress adhesion of flux, a coating agent, a solder ball, a foreign material, etc. to connector-side housing seal portion 51a.

[Second Embodiment]

Figure 8A:
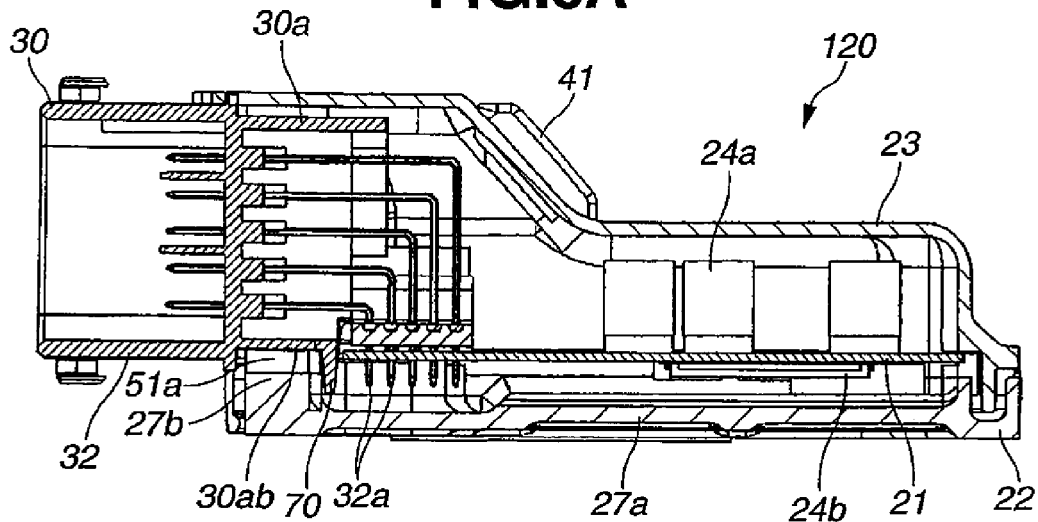
FIG. 8A is a sectional view similar to FIG. 7A, but shows an electronic control device according to a second embodiment of the present invention.
Figure 8B:
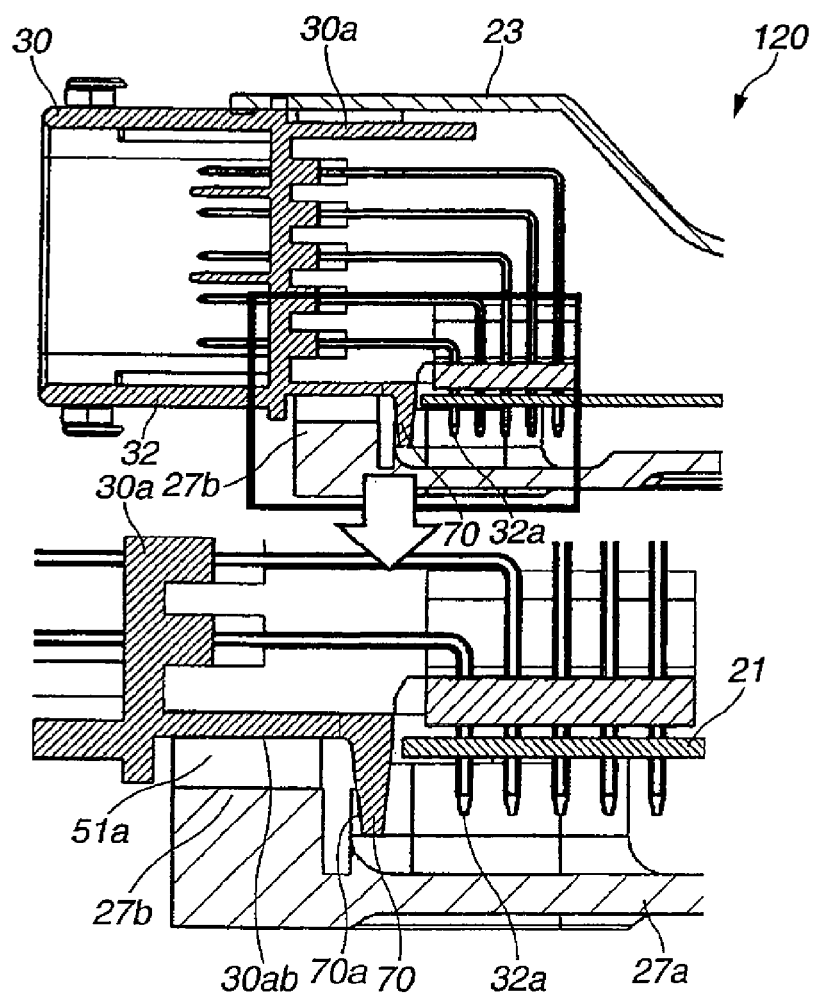
FIG. 8B is an enlarged sectional view of essential parts of the electronic control device according to the second embodiment of the present invention as shown in FIG. 8A.

Referring to FIG. 8A and FIG. 8B, barrier portion 70 used in electronic control device 120 according to a second embodiment will be explained. The second embodiment differs from the first embodiment in configuration of barrier portion 70. Like reference numerals denote like parts, and therefore, detailed explanations therefor are omitted. As shown in FIG. 8B, barrier portion 70 includes tapered portion 70a tapered toward a tip end of barrier portion 70 which is opposed to the upper surface of bottom wall 27a of case 22.

With the provision of tapered portion 70a of barrier portion 70, an application nozzle for applying the flux and the coating agent to the board connecting portions of connector pins 31a, 32a can be prevented from contacting barrier portion 70. Further, it is possible to facilitate molding of barrier portion 70.

[Third Embodiment]

Referring to FIG. 9A and FIG. 9B, barrier portion 70 used in electronic control device 220 according to a third embodiment will be explained. The third embodiment differs from the second embodiment in configuration of tapered portion 70a of barrier portion 70. Like reference numerals denote like parts, and therefore, detailed explanations therefor are omitted. As shown in FIG. 9A and FIG. 9B, tapered portion 70a of barrier portion 70 includes rounded tip end portion 70b.

With this construction in which barrier portion 70 has a tapered portion with rounded tip end portion 70b, it is possible to more effectively prevent the application nozzle for applying the flux and the coating agent to the board connecting portions of connector pins 31a, 32a from contacting barrier portion 70. In addition, it is possible to further facilitate molding of barrier portion 70.

[Fourth Embodiment]

Figure 10A:
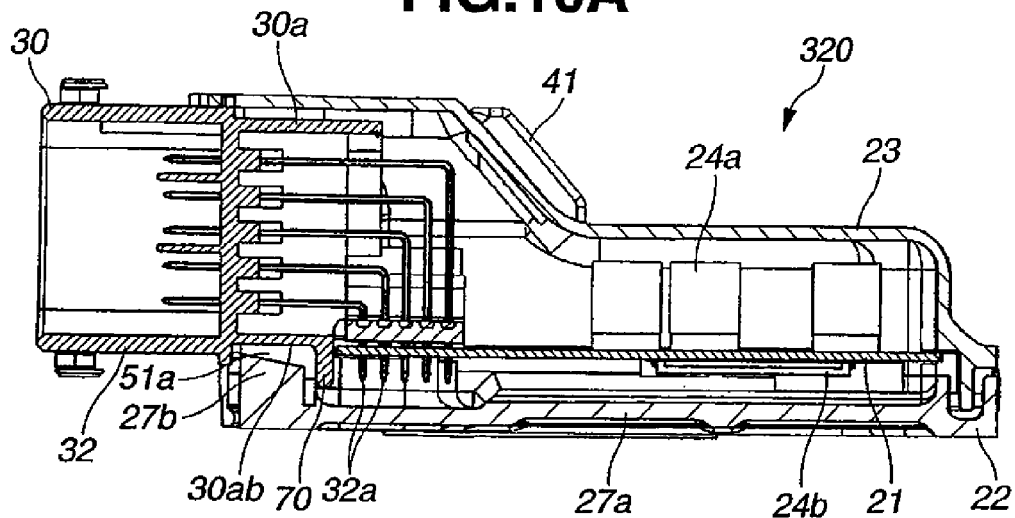
FIG. 10A is a sectional view similar to FIG. 7A, but shows an electronic control device according to a fourth embodiment of the present invention.
Figure 10B:
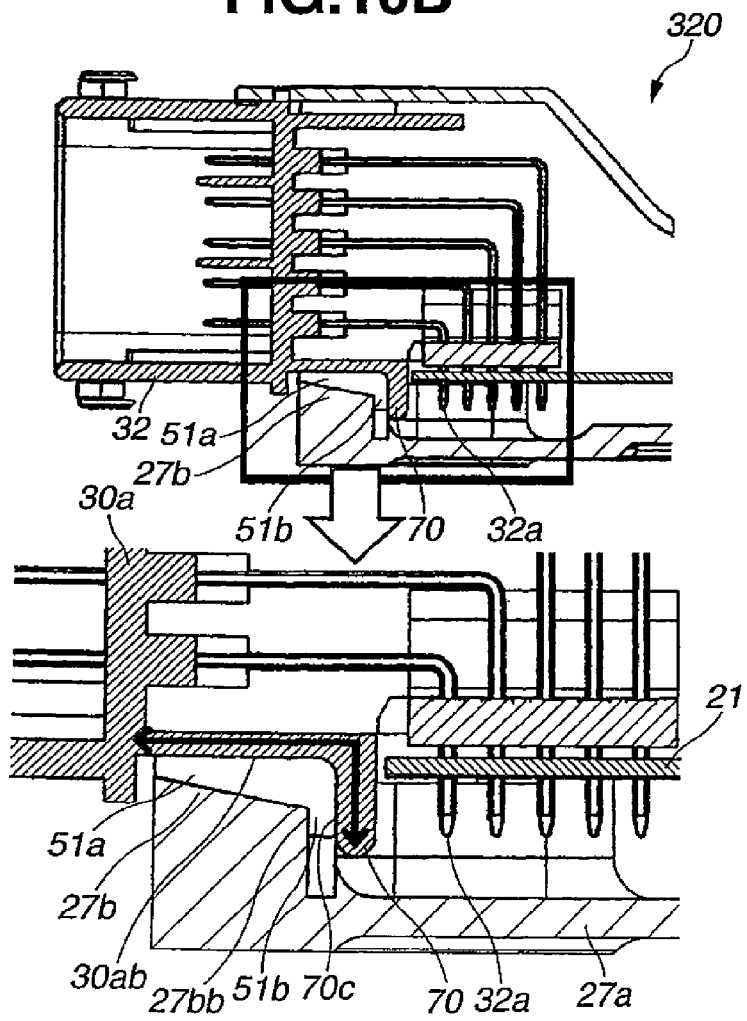
FIG. 10B is an enlarged sectional view of essential parts of the electronic control device according to the fourth embodiment of the present invention as shown in FIG. 10A.
Figure 11:
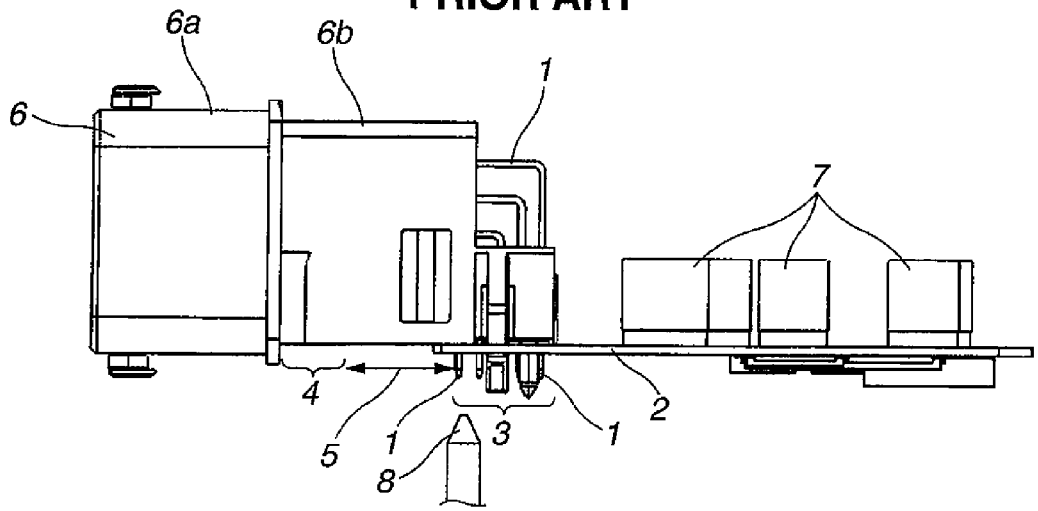
FIG. 11 is a side view of an electronic control device of a conventional art with a housing being removed.
Figure 12A:
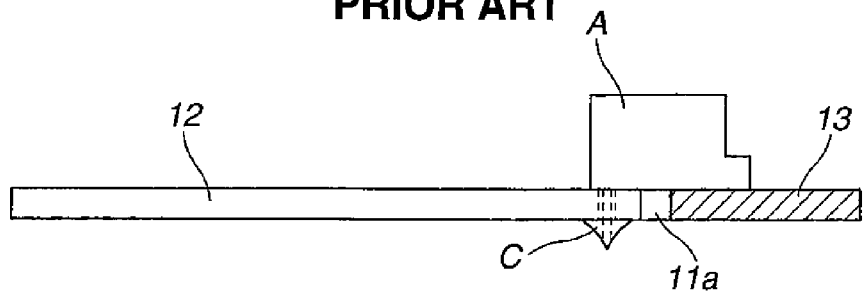
FIG. 12A a side view of a printed circuit board with a connector of an electronic control device of a conventional art.
Figure 12B:
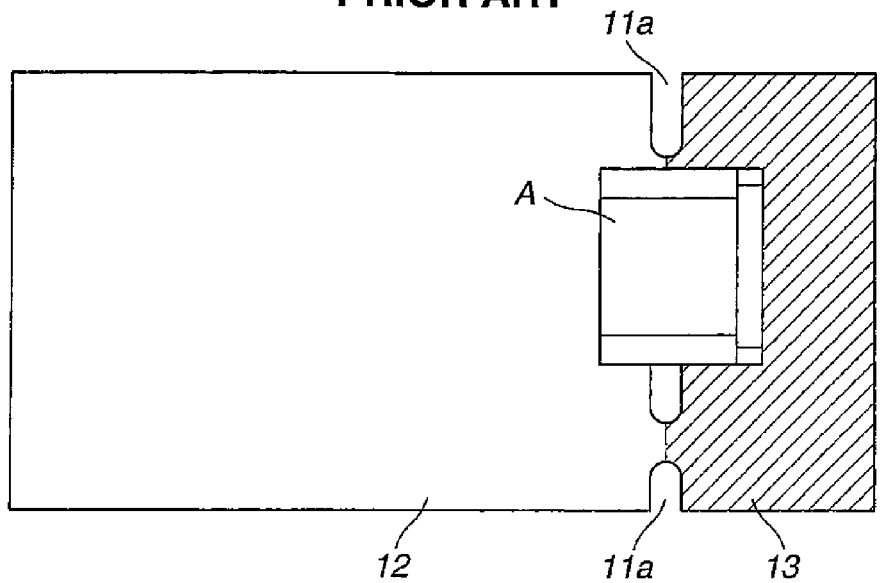
FIG. 12B a bottom plan view of the printed circuit board of the electronic control device as shown in FIG. 12A.

Referring to FIG. 10A and FIG. 10B, barrier portion 70 used in electronic control device 320 according to a fourth embodiment will be explained. The fourth embodiment differs from the first embodiment in that connector-side housing seal portion 51a includes extension seal portion 51b. Like reference numerals denote like parts, and therefore, detailed explanations therefor are omitted. As shown in FIG. 10A and FIG. 10B, connector-side housing seal portion 51a has an L-shape in section, and includes extension seal portion 51b extending toward bottom wall 27a of case 22 in a space between wall surface 27bb of front wall 27b of case 22 and front side surface 70c of barrier portion 70 which is opposed to wall surface 27bb of front wall 27b of case 22. Connector-side waterproof seal portion and extension seal portion 51b are formed by filling a sealant. That is, the sealant is filled in the space between wall surface 27bb of front wall 27b of case 22 and front side surface 70c of barrier portion 70 in addition to the space between lower surface 30ab of mount base portion 30a of connector 30 and the upper surface of front wall 27b of case 22.

Since extension seal portion 51b is disposed between wall surface 27bb of front wall 27b of case 22 and front side surface 70c of barrier portion 70, a seal length of connector-side waterproof seal portion 51a becomes a sum of the width of connector-side housing seal portion 51a in a direction perpendicular to the longitudinal direction of front wall 27b along lower surface 30ab of mount base portion 30a of connector 30 and an amount of projection of barrier portion 70 which projects from lower surface 30ab of mount base portion 30a. As a result, the seal length of connector-side waterproof seal portion 51a is increased to thereby enhance salt damage resistance. Further, it is possible to ensure a necessary seal length and also reduce a dimension of the width of connector-side housing seal portion 51a to thereby downsize of electronic control device 320.

In addition, a fit portion into which a tip end of barrier portion 70 is fittable may be provided in a portion of one of housing members 22, 23 which is opposed to the tip end of barrier portion 70. With the provision of the fit portion, barrier portion 70 can be used as a stress-resistant member.

This application is based on a prior Japanese Patent Application No. 2012-202209 filed on Sep. 14, 2013. The entire contents of the Japanese Patent Application No. 2012-202209 are hereby incorporated by reference.

Although the invention has been described above by reference to certain embodiments and modifications of the invention, the invention is not limited to the embodiments and the modifications as described above. Further variations of the embodiments and the modifications as described above will occur to those skilled in the art in light of the above teachings. The scope of the invention is defined with reference to the following claims.

What is claimed is:

1. An electronic control device comprising:
   a circuit board;
   a connector disposed on one side of the circuit board, the connector being provided with connector pins having a board connecting portion at which the connector pins are electrically connected with the circuit board;
   first and second housing members accommodating the circuit board and the connector therebetween such that the connector is opposed to a peripheral edge portion of the first housing member and a peripheral edge portion of the second housing member;
   a waterproof seal portion through which connection between the connector and the first and second housing members and connection between the first and second housing members are provided in a fluid-tight manner, the waterproof seal portion comprising a connector-side waterproof seal portion disposed between the connector and the first housing member which is opposed to the board connecting portion of the connector pins; and
   a barrier portion disposed between the board connecting portion of the connector pins and the connector-side waterproof seal portion.

2. The electronic control device as claimed in claim 1, wherein the barrier portion projects from the connector toward the first housing member by an amount larger than an amount of projection of the connector pins that project from one surface of the circuit board toward the first housing member, the one surface of the circuit board being opposed to the first housing member.

3. The electronic control device as claimed in claim 1, wherein the connector-side waterproof seal portion comprises an extension seal portion extending toward the first housing member in a space between a wall surface of the peripheral edge portion of the one first housing member and a side surface of the barrier portion which is opposed to the wall surface of the peripheral edge portion of the first housing member, and wherein the connector-side waterproof seal portion and the extension seal portion are filled with a sealant.

4. The electronic control device as claimed in claim 1, wherein the connector comprises a mount base portion through which the connector is fixed to the circuit board, the barrier portion being formed on the mount base portion.

5. The electronic control device as claimed in claim 1, wherein the barrier portion comprises a tapered portion tapered toward a tip end of the barrier portion which is opposed to the first housing member.

6. The electronic control device as claimed in claim 1, wherein the barrier portion comprises a tapered portion having a rounded tip end portion.

7. The electronic control device as claimed in claim 1, further comprising a fixing construction through which the first and second housing members are fixedly assembled to each other.

8. The electronic control device as claimed in claim 7, wherein the fixing construction is a snap-fit fixing construction comprising an elastically deformable pawl formed on the second housing member and a projection formed on the first housing member, the pawl and the projection being engaged with each other.

9. The electronic control device as claimed in claim 7, wherein the fixing construction is a heat staking fixing construction comprising a heat staking peg formed on the second housing member and a peg hole formed in the first housing member, the heat staking peg and the peg hole being engaged with each other.

10. The electronic control device as claimed in claim 1, wherein the second housing member is made of either a synthetic resin material or a metal material.

11. An electronic control device comprising:
    a circuit board;
    a connector disposed on one side of the circuit board, the connector being provided with connector pins having a board connecting portion at which the connector pins are electrically connected with the circuit board;
    first and second housing members accommodating the circuit board and the connector therebetween such that the connector is opposed to a peripheral edge portion of the first housing member and a peripheral edge portion of the second housing member;
    a waterproof seal portion through which connection between the connector and the first and second housing members and connection between the first and second housing members are provided in a fluid-tight manner, the waterproof seal portion comprising a connector-side waterproof seal portion disposed between the connector and the first housing member which is opposed to the board connecting portion of the connector pins; and
    a barrier portion disposed completely between the board connecting portion of the connector pins and the connector-side waterproof seal portion, to prevent flux, coating agent and/or solder from the board connecting portion of the connector pins, from being adhered to the connector-side waterproof seal portion.

12. An electronic control device comprising:
    a circuit board;
    a connector disposed on one side of the circuit board, the connector being provided with connector pins having a board connecting portion at which the connector pins are electrically connected with the circuit board;
    first and second housing members accommodating the circuit board and the connector therebetween such that the connector is opposed to a peripheral edge portion of the first housing member and a peripheral edge portion of the second housing member;

a waterproof seal portion through which connection between the connector and the first and second housing members and connection between the first and second housing members are provided in a fluid-tight manner, the waterproof seal portion comprising a connector-side waterproof seal portion disposed between the connector and the first housing member which is opposed to the board connecting portion of the connector pins; and a barrier portion completely intervening between the board connecting portion of the connector pins and the connector-side waterproof seal portion, to prevent flux, coating agent and/or solder from the board connecting portion of the connector pins, from being adhered to the connector-side waterproof seal portion.

* * * * *